(12) United States Patent
Maxwell et al.

(10) Patent No.: US 11,726,153 B2
(45) Date of Patent: Aug. 15, 2023

(54) DIGITAL Q-METER FOR CONTINUOUS-WAVE NMR

(71) Applicant: JEFFERSON SCIENCE ASSOCIATES, LLC, Newport News, VA (US)

(72) Inventors: James Maxwell, Newport News, VA (US); Hai Dong, Yorktown, VA (US); Christopher Keith, Newport News, VA (US); Chris Cuevas, Yorktown, VA (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 507 days.

(21) Appl. No.: 16/903,766

(22) Filed: Jun. 17, 2020

(65) Prior Publication Data

US 2021/0396825 A1 Dec. 23, 2021

(51) Int. Cl.
*G01R 33/36* (2006.01)
(52) U.S. Cl.
CPC ................................ *G01R 33/3671* (2013.01)
(58) Field of Classification Search
CPC .............. G01R 33/3671; G01R 33/543; G01R 33/5608; G01R 33/4828; G01R 33/3415; G01R 33/283; G01R 33/307; G01R 33/60; G01V 3/32; E21B 49/08; E21B 2049/085; G01N 24/10
See application file for complete search history.

(56) References Cited

U.S. PATENT DOCUMENTS

| 3,970,925 A | 7/1976 | Proctor et al. |
| 4,124,813 A | 11/1978 | Mefed et al. |
| 9,927,505 B2 * | 3/2018 | Driscoll ................ G01R 33/345 |
| 2016/0018494 A1 * | 1/2016 | Driscoll ............. G01R 33/3614 324/309 |
| 2019/0219726 A1 * | 7/2019 | Ramirez .................. G01V 3/32 |

* cited by examiner

*Primary Examiner* — Jermele M Hollington
*Assistant Examiner* — Taqi R Nasir

(57) ABSTRACT

A method to perform continuous-wave NMR measurements of nuclear magnetization at high magnetic fields, above 2.5 T, without analog down-mixing is described. An FPGA controls a digital clock pulse which is used to stimulate a resonant circuit and provide a reference signal. An algorithm determines the real portion of a resonant circuit signal near the Larmor frequency of the species of interest using only two measurements of the waveform per cycle. The FPGA automatically alters a variable capacitance to tune the resonant circuit to the Larmor frequency.

14 Claims, 2 Drawing Sheets

DIGITAL Q-METER FOR CONTINUOUS-WAVE NMR

The United States of America may have certain rights to this invention under Management and Operating Contract contract DE-AC05-06OR23177 from the United States Department of Energy.

FIELD OF THE INVENTION

The present invention relates to continuous-wave nuclear magnetic resonance measurements of nuclear magnetization at high magnetic fields, and particularly a method to perform such measurements via direct digital acquisition, without the need for analog frequency mixer components.

BACKGROUND OF THE INVENTION

The nucleus of many atoms, including the most abundant atomic species hydrogen, have an intrinsic angular momentum called spin. The spin causes the nuclei to have minute magnetic properties that can be influenced by either a static or alternating external magnetic field. When a sample of spins is placed in a static field, each individual spin will tend to align itself parallel to the field direction or oppose it. The population difference between these directions is called the polarization, or magnetization, of the sample. Measurement or manipulation of the magnetization can be very difficult to achieve but can be used to reveal numerous properties of the sample environment or even the fundamental origin of the spin itself. The most powerful technique for these measurements is Nuclear Magnetic Resonance (NMR) which utilizes the fact that the spins rotate about the external field with a characteristic frequency called the Larmor, or NMR, frequency. An alternating field, tuned to this frequency, can cause the spins to reverse their direction relative to the static one. The reversal of the spins can be measured using a number of electronic methods, one of which is called a q-meter.

Continuous-wave Nuclear Magnetic Resonance (NMR) techniques can be used to precisely measure the net magnetization of a nuclear species in a sample of interest within a large (>2 T) magnetic holding field. Central to these measurements is a device called a Q-Meter, which observes the complex impedance of an inductive, capacitive, resistive (LCR) circuit under radio frequency (RF) stimulus where the inductor is an NMR coil magnetically coupled to the sample. By sweeping the frequency of the RF stimulus through the Larmor precession frequency of the nuclear spins of interest, the magnetic field induced in the NMR coil can drive spin flips transitions of the Zeeman-splitting energy levels in these spins. Depending on the average orientation of the spins to the field, the spin flips either absorb or emit energy as they interact with the induced NMR field, and the resulting change in circuit impedance is measured with the Q-Meter.

The spin system's response to the induced RF field is its magnetic susceptibility, $\chi(\omega)$, and is a function of the RF frequency $\omega$. The magnetic susceptibility consists of a dispersive term $\chi'(\omega)$ and an imaginary absorptive term $\chi''(\omega)$. This absorptive term can be integrated in frequency to give a proportional measure of the sample magnetization M:

$$\chi(\omega)=\chi'(\omega)-i\chi''(\omega), M=K\int_0^\infty \chi''(\omega)d\omega \quad (1)$$

Here K contains information on the sample nucleus as well as the properties of the NMR system. Since $\omega''(\omega)$ is non-zero only in a small range around the Larmor frequency, the integral only need be performed very close to center. The inductance of the embedded coil couples to the magnetic susceptibility, via a filling factor $\eta$, $$L_C(\omega)=L_0[1+4\pi\eta\chi(\omega)] \quad (2)$$

so that a measurement that isolates the real part of the complex impedance of the coil versus frequency ($\sim i\omega L_C(\omega)$) will give a proportional measure of the magnetization. It is the Q-Meter which performs this task.

As shown in FIG. 1, a traditional Q-Meter measures magnetization of a material sample 1 via the complex impedance of the LCR circuit 2, comparing the LCR signal to a reference signal using a phase sensitive detector (PSD). The sample is a material with nuclear species of interest with an inductor near or embedded within its bulk. The LCR circuit 2 is a resonant circuit with fixed resistance and inductance, and variable capacitance. The phase sensitive detector, traditionally a balanced ring modulator, is a frequency mixer which returns the real portion of the signal 3 when the phase of the signal and reference are matched. A tunable delay is used to perform this phase matching. The excitation signal and reference signal are produced by an RF signal generator shown as RF Source 4. An RF amplifier is required to boost the small signal output of the LCR circuit to sufficient power to drive the detectors. The capacitance of the LCR circuit can be tuned so that the circuit resonates at Larmor frequency of the nucleus of interest, $\omega_0=1/\sqrt{LC}$. To monitor the resonant frequency of the LCR circuit during tuning, the magnitude of the signal 5 is utilized, typically produced with a diode rectifier circuit. The magnitude of the signal 5 is the output of the total detector, which is the magnitude of the resonant signal. The imaginary portion of the signal may be obtained using a 90 degree delay to a second mixer, producing a third signal to be measured.

The traditional Q-meter requires a number of carefully chosen components to make effective measurements. An off-the-shelf RF generator with very low noise, particularly low phase-noise, provides the RF excitation voltage and reference, and typically is an expensive, rack-mounted, external unit to the main Q-meter. The Q-meter itself consists of an analog mixer, as well as RF amplifiers, differential amplifiers and attenuators chosen to maintain linear operation of the circuit and nominal voltage input to the mixer. These components have rated frequency ranges, and changes in temperature can affect their operation. Both the output of the mixer and the magnitude of the signal from the diode rectifier are amplified and sent to be recorded by an ADC on an external, off-the-shelf DAQ system.

To prepare a Q-meter for a measurements, the resonant circuit must first be tuned. This sets the frequency of the LCR circuit to the Larmor frequency of the nuclear species of interest at the magnetic holding field, and adjusts the delay line to match the phase between the reference and signal at the mixer. The first step in tuning is selecting correct transmission lines between the LCR circuit and the Q-meter, in some multiple of the RF wavelength divided by two, to minimize its contribution to the complex impedance. Next the tuning capacitance is changed, via a rotary variable capacitor or electronically adjusted capacitor, to minimize the response magnitude at the Larmor frequency. Finally, the phase is adjusted by changing the length of the delay line or adjusting the voltage on a electronic phase shifter. Each step of this process is performed manually by the operator.

To perform a measurement of nuclear magnetization, the signal generator is swept in frequency through the nuclear Larmor frequency, allowing the Q-Meter to observe the complex impedance of the LCR circuit at a frequency range about the center. The frequency is swept by increments from below the Larmor frequency of the proton to above it, taking a voltage measurement from the PSD at each point. Many such frequency sweeps are averaged together to reduce noise. The response of the LCR circuit with no polarization signal is called the "Q-curve," and this background response must be subtracted to extract the desired measurement. This is done by subtracting away a polynomial fit to the curve, excluding the portion of the curve near the Larmor frequency. The subtracted signal is integrated to give a proportional measurement of the nuclear magnetization of the sample.

OBJECTS OF THE INVENTION

It is an object of this invention to reduce the cost and size of a Q-meter system, while removing the external RF generator and data acquisition components. This invention obviates the manual process of tuning the resonant circuit and compensating for temperature drifts. This invention will remove the need for separate analog mixers to determine the real and imaginary portions of the resonant signal.

SUMMARY OF THE INVENTION

In order to overcome the limitations of traditional Q-meter techniques, this invention utilizes fast ADC acquisition of the resonant circuit signal and mixing algorithms in an FPGA to replace the analog mixer. Tuning and temperature compensation are performed algorithmically without the need for user intervention. External RF generator and data acquisition systems are replaced with internal clock and ADC components directly controlled by the FPGA.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Our new digital Q-Meter removes the need for down-mixing in a phase sensitive detector by directly determining the resonant signal and reference signal using fast ADCs. This system does not require user-dependent circuit tuning and eliminates feedback of the reference signal to the total detector through the mixer. By performing calibrations and scaling in the programming, variations among the necessary analog circuit components can be corrected in a way not possible with an analog Q-Meter. This method leverages precise digital delays to directly determine full RF waveforms using as few as two samples per cycle.

Figure 1:
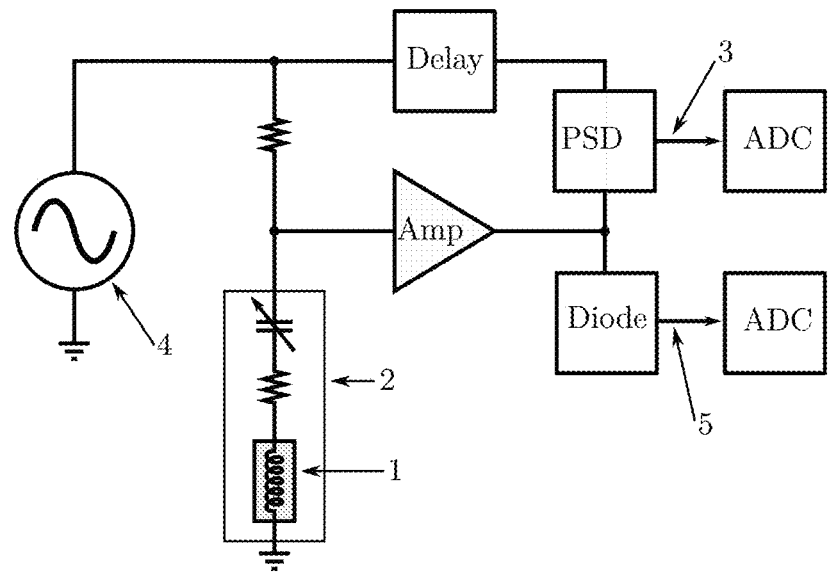
FIG. 1 shows a traditional Q-meter design.
Figure 2:
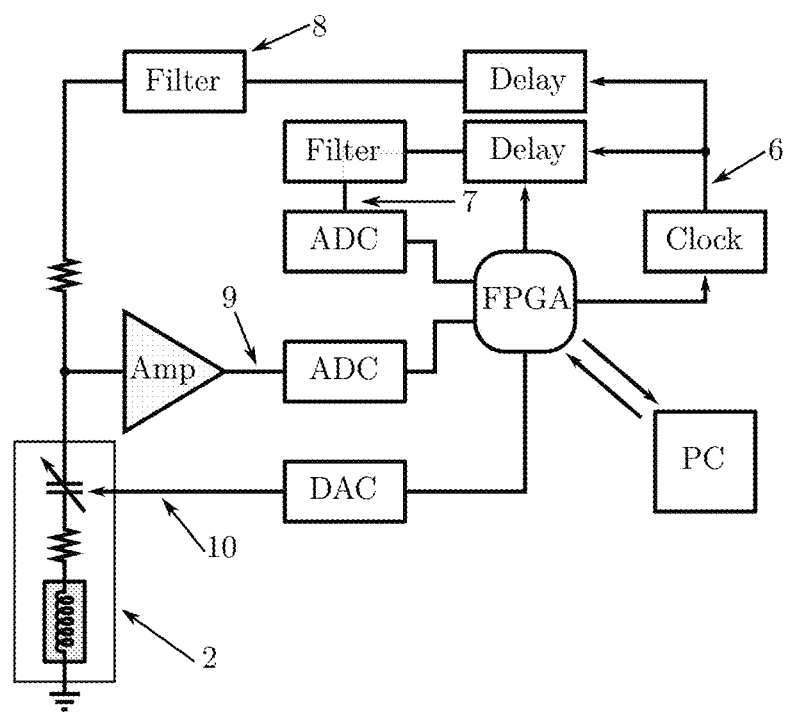
FIG. 2 shows the novel digital Q-meter design.

Our digital Q-Meter, shown in FIG. 2, centers around a field-programmable gate array (FPGA) which performs the necessary calculations for the measurement. The FPGA controls a clock pulse 6, which is a square wave pulse signal from the clock used both to trigger the ADC measurements and to produce RF signals. Clock pulses are sent through low pass filters, producing sine waves for stimulating the LCR circuit 2 and as reference. The reference signal 7, which is a reference signal created from the clock pulse after phase matching with a digital delay, is sent through a digital delay to allow phase control, before filtering and digitization in the ADC. The stimulus signal is filtered by a low pass filter 8, which converts the square wave clock pulse into a single-frequency sinusoidal signal, and sent to the LCR circuit, and the LCR signal is where it is amplified and digitized to create the resonant signal 9. The FPGA also controls the voltage on a varactor capacitor 10 to allow direct tuning of the LCR resonance frequency. The capacitance bias is a bias voltage to control the variable capacitor 10 and is set by the FPGA using the DAC.

Figure 3:
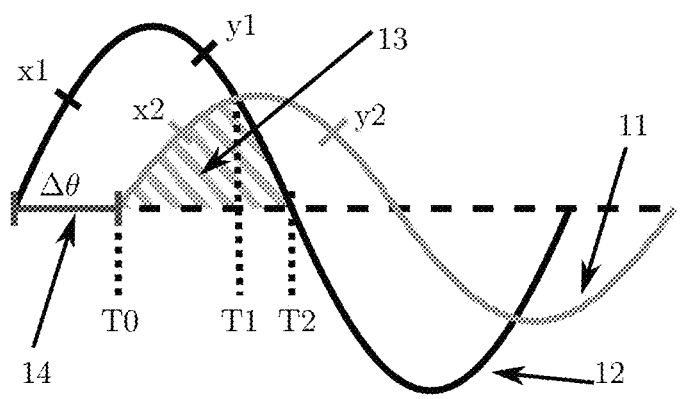
FIG. 3 shows the determination of the real power of the signal from two measured points on the reference and signal waveforms.

While the digital Q-Meter eliminates analog down-mixing and manual tuning, it trades them for complex programming. The program consists of firmware and software that run on the FPGA and a host computer, respectively. As seen in FIG. 3, the two ADCs reading two samples per cycle at 90° phase from each other: $x_1$ and $y_1$ for the reference, and $x_2$ and $y_2$ for the LCR signal. This allows the determination of the reference waveform 12, which is available from the clock, and signal waveform 11, which is the resonant signal waveform or signal waveform from the resonant circuit. With the angular frequency ($\omega=2\pi f$) of the signals known, these two points can be used to parametrically determine the amplitude (A) and phase ($\theta$) of each sine wave $A_i \sin(\omega t + \theta_i)$:

$$A_i = \sqrt{x_i^2 + y_i^2}, \quad \theta_i = \arctan(y_i/x_i) \tag{3}$$

The total component of the LCR signal is $A_2$. The real component of the LCR signal is the shaded area under both waveforms indicated by real area 13, which is the area under both the signal and reference curves, which corresponds to the real portion of the signal power and is found by integrating between time points $T_0$, $T_1$, and $T_2$. $T_0$ is determined from the phase difference between signals $\Delta\theta = \theta_2 - \theta_1$, which is indicated as the phase difference 14, which is the difference between the signal and reference waveforms, and $T_2$ is half a cycle. To determine $T_1$, we find the intersection of the two signals where they are equal:

$$A_1 \sin(\omega T_1) = A_1 \sin(\omega T_1 + \Delta\theta) \Rightarrow T_1 = \frac{1}{\omega} \arctan\left(\frac{\sin \Delta\theta}{\cos \Delta\theta - A_1/A_2}\right). \tag{4}$$

Then the real component (X) of the signal can be then expressed as $$X = \int_{T_0}^{T_1} A_2 \sin(\omega t + \Delta\theta) + \int_{T_1}^{T_2} A_1 \sin(\omega t) \tag{5}$$
$$= A_2 (\cos(\omega T_0) - \cos(\omega T_1)) + A_1 (\cos(\omega T_1) - \cos(\omega T_2)).$$

Using these expressions, the program performs the following steps to produce a measurement:
1. For the first point of the frequency sweep, read reference samples $x_1$, $y_1$ and signal samples $x_2$, $y_2$ in each ADC, averaging many points to reduce noise.
2. Determine amplitude and phase of reference and signal using Equation 3.
3. Calculate the total signal component and real component using Equation 5.
4. Tune the capacitance of the LCR circuit to the center, Larmor frequency.
   Set the programmable clock to the center frequency Change the DAC voltage on the varactor diode variable capacitor, repeating steps 1 to 3 until $A_2$ is at a minimum.

5. Tune the delay so that the reference and signal are in phase.

Set the DAC voltage to that corresponding to the center frequency

Change the delay, repeating steps 1 to 3 until X is at a maximum.

6. Obtain Q-curves.

Set the programmable clock to the first point in the frequency sweep range.

For each frequency step, repeat steps 1 to 3, obtaining total and real components.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of digitally acquiring continuous-wave NMR measurements above 5 MHz and up to a desired sampling frequency comprising an algorithm to produce real and imaginary components of a signal from two measurements each of the signal and a reference waveform per cycle, the two measurements being 90 degrees separated in time.

2. The method of claim 1 wherein the algorithm comprises:
a field programmable gate array (FPGA) to control clock pulses;
a first ADC to create a reference signal;
a second ADC to create a resonant signal; and
sending the clock pulses through low pass filters to produce sine waves.

3. The method of claim 2 comprising sending the clock pulses through low pass filters; and producing sine waves with the low pass filters to stimulate an impedance-capacitive-resistive (LCR) circuit.

4. The method of claim 3 comprising sending the resonant signal through a digital delay to allow phase control before filtering and digitization in the second ADC.

5. The method of claim 4 comprising filtering the stimulus signal; and sending the stimulus signal to the LCR circuit.

6. The method of claim 5 comprising amplifying and digitizing the LCR signal.

7. The method of claim 6 comprising setting a bias voltage with the FPGA; and sending the bias voltage to control a variable capacitor in the LCR.

8. A method of digitally acquiring continuous-wave NMR measurements above 5 MHz and up to a desired sampling frequency wherein the NMR measurements are acquired using a field programmable gate array (FPGA) comprising the following steps:

a) for the first point of the frequency sweep, reading reference samples $x_1$, $y_1$ and signal samples $x_2$, $y_2$ in each ADC, and averaging many points to reduce noise;

b) determining amplitude and phase of reference and signal;

c) calculating the total signal component and real component;

d) tuning the capacitance of the LCR circuit to the center, Larmor frequency; and e) tuning the delay so that the reference and signal are in phase; and obtaining Q-curves.

9. The method of claim 8 wherein tuning the capacitance of the LCR circuit comprises, for each point of the frequency sweep: setting the programmable clock to the center frequency; changing the DAC voltage on the varactor diode variable capacitor; and repeating steps a) to c) of claim 8 until $A_2$ is at a minimum.

10. The method of claim 9 wherein tuning the delay comprises: setting the DAC voltage to that corresponding to the center frequency; changing the delay; and repeating steps a) to c) of claim 9 until X is at a minimum.

11. The method of claim 10 wherein obtaining Q-curves comprises:
setting the pro-grammable clock to the first point in the frequency sweep range; and repeating steps a) to c) of claim 9 for each frequency sweep to obtain real components.

12. The method of claim 2 wherein the algorithm comprises:
reading from the ADCs two samples per cycle at 90° phase from each other;
reading the angular frequency of the signals;
determining a reference waveform and a signal waveform; and
determining parametrically the amplitude (A) and phase (θ) of each sine wave $A_i \sin(\omega t + \theta_i)$:

$$A_i = \overline{x_i^2 + y_i^2}, \ \theta_i = \arctan(y_i/x_i). \tag{6}$$

13. The method of claim 12 comprising: integrating between time points $T_0$, $T_1$, and $T_2$, $T_0$ from the phase difference between signals $\Delta\theta = \theta_2 - \theta_1$, wherein $T_2$ is half a cycle; and finding the intersection of the two signals where they are equal to determine determining $T_1$.

14. The method of claim 13 comprising: determining the real component (X) of the signal by the following equation $$X = \int_{T_0}^{T_1} A_2 \sin(\omega t + \Delta\theta) + \int_{T_1}^{T_2} A_1 \sin(\omega t) \tag{7}$$

$$= A_2 (\cos(\omega T_0) - \cos(\omega T_1)) + A_1 (\cos(\omega T_1) - \cos(\omega T_2)). \tag{8}$$

* * * * *